United States Patent [19]
Rha

[11] Patent Number: 6,091,296
[45] Date of Patent: Jul. 18, 2000

[54] SINGLE LOOP FEEDFORWARD AMPLIFIER FOR USE IN AN RF TRANSMITTER AND METHOD OF OPERATION

[75] Inventor: Peter S. Rha, Richardson, Tex.

[73] Assignee: Samsung Electronics Co., Ltd., Rep. of Korea

[21] Appl. No.: 09/134,194

[22] Filed: Aug. 14, 1998

[51] Int. Cl.[7] .................................................. H03F 1/32
[52] U.S. Cl. ............................................ 330/149; 330/151
[58] Field of Search ..................................... 330/107, 124, 330/149, 151; 375/296, 297

[56] References Cited

U.S. PATENT DOCUMENTS

| | | | |
|---|---|---|---|
| 4,048,579 | 9/1977 | Carlsson | 330/151 |
| 4,580,105 | 4/1986 | Myer | 330/149 |
| 4,879,519 | 11/1989 | Myer | 330/149 |
| 4,885,551 | 12/1989 | Myer | 330/52 |
| 5,155,448 | 10/1992 | Powell | 330/149 |
| 5,304,945 | 4/1994 | Myer | 330/149 |
| 5,489,875 | 2/1996 | Cavers | 330/151 |
| 5,570,350 | 10/1996 | Myer et al. | 370/18 |
| 5,619,168 | 4/1997 | Myer | 330/149 |

Primary Examiner—Steven J. Mottola
Attorney, Agent, or Firm—John C. Han

[57] ABSTRACT

There is disclosed, for use in a wireless network, a single-loop feedforward amplification system. The single loop comprises a main amplification branch and a feedforward branch in parallel to the main amplification branch. The main amplification branch contains a delay line that receives and delays the initial low-power input signal, and a power amplifier that amplifies the delayed input signal to produce an amplified output signal. The feedforward branch also receives the input signal and generates an distortion correction signal to compensate for the distortion produced at the output of the power amplifier due to its non-linearity. The distortion correction signal and the distorted amplified output signal are then combined to create a corrected amplified output signal without distortion.

20 Claims, 8 Drawing Sheets

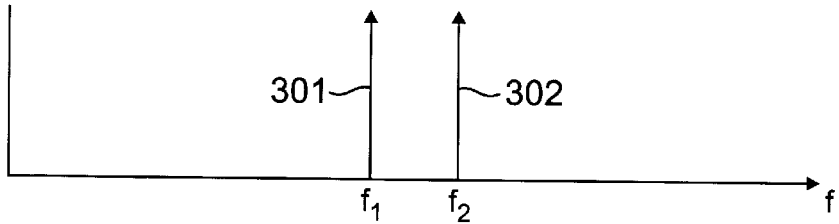
FIG. 3A
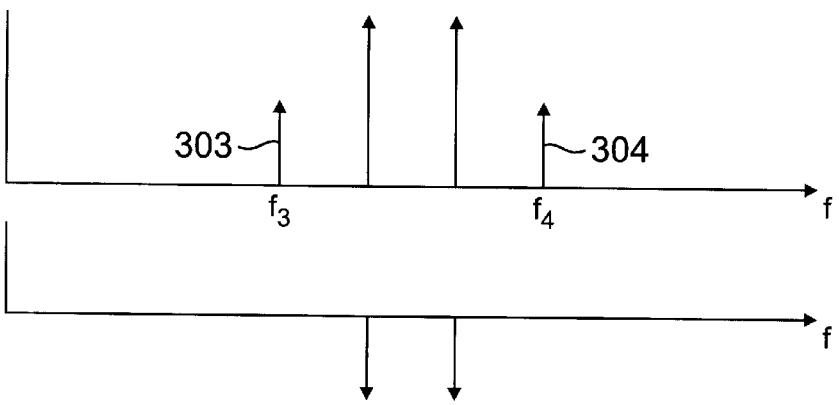
FIG. 3B
FIG. 3C
FIG. 3D
FIG. 3E
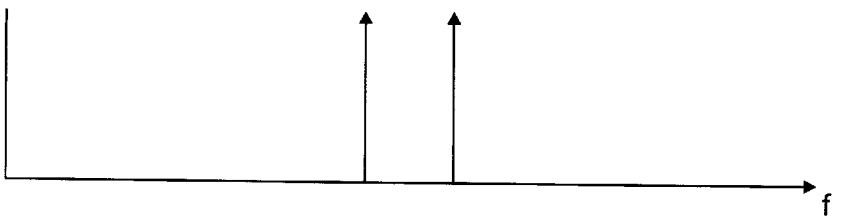
FIG. 3F

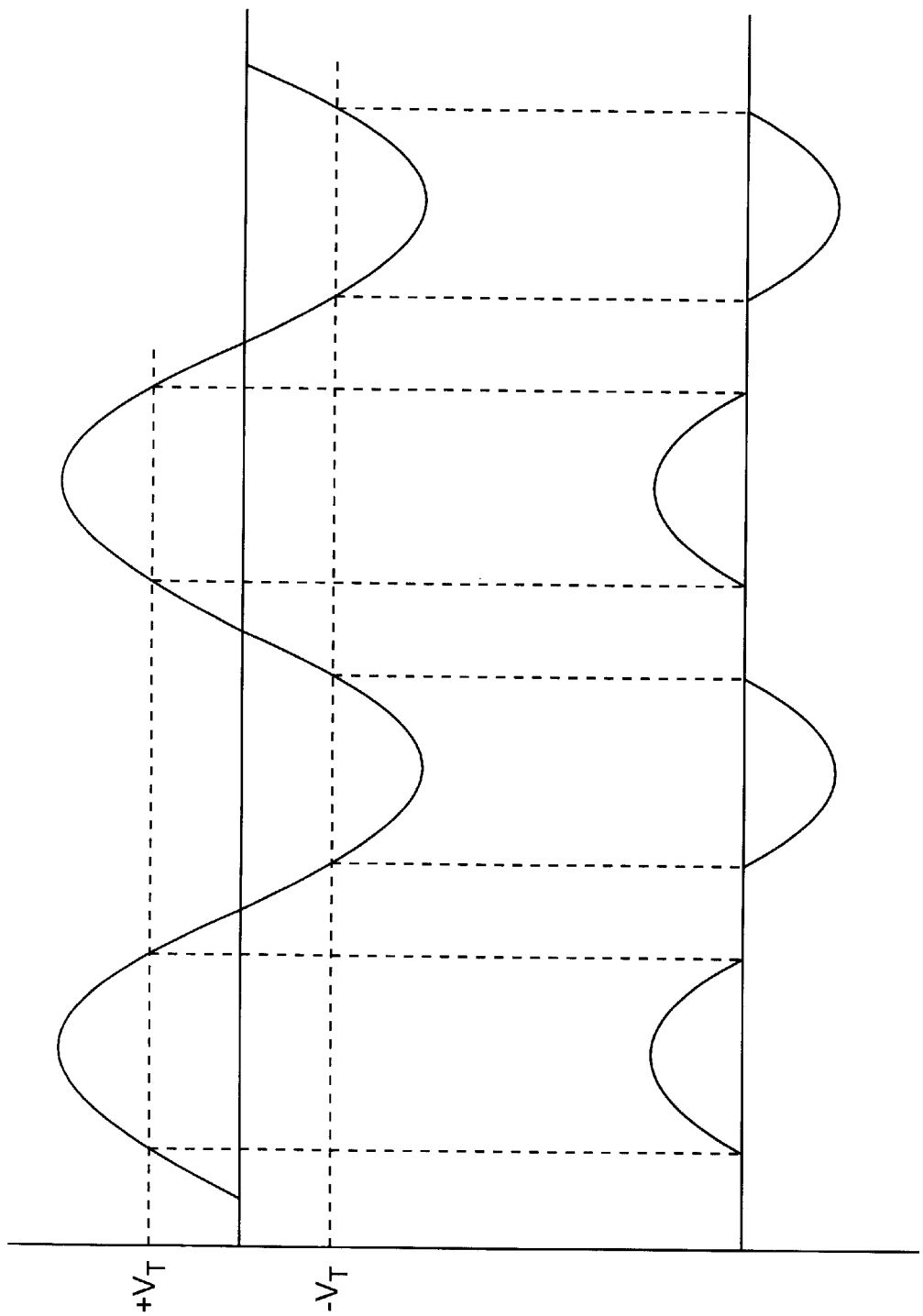

SINGLE LOOP FEEDFORWARD AMPLIFIER FOR USE IN AN RF TRANSMITTER AND METHOD OF OPERATION

CROSS-REFERENCE TO RELATED APPLICATIONS

The present invention is related to that disclosed in U.S. patent application Ser. No. 09/174,760, entitled "DIGITAL FEEDFORWARD AMPLIFIER FOR USE IN AN RF TRANSMITTER AND METHOD OF OPERATION" and filed concurrently herewith. U.S. patent application Ser. No. 09/174,760 is commonly assigned with the present invention and is incorporated herein by reference for all purposes.

TECHNICAL FIELD OF THE INVENTION

The present invention is directed, in general, to feedforward amplifiers and, more specifically, to single loop feedforward amplifier for use in a CDMA transmitter.

BACKGROUND OF THE INVENTION

In 1996, more than 75 million people worldwide used cellular telephones. Reliable predictions indicate that there will be over 300 million cellular telephone customers by the year 2000. Within the United States, cellular service is offered not only by dedicated cellular service providers, but also by the regional Bell companies, such as U.S. West, Bell Atlantic and Southwestern Bell, and the national long distance companies, such as AT&T and Sprint. The enhanced competition has driven the price of cellular service down to the point where it is affordable to a large segment of the population.

This competition has also led to rapid and sweeping innovations in cellular telephone technology. Analog cellular systems are now competing with digital cellular systems. In order to maximize the number of subscribers that can be serviced in a single cellular system, frequency reuse is maximized by making individual cell sites smaller and using a greater number of cell sites to cover the same geographical area. Accordingly, the increased number of cellular base stations has resulted in increased infrastructure costs. To offset this increased cost, cellular service providers are eager to implement any innovations that may reduce equipment costs, maintenance and repair costs, and operating costs, or that may increase service quality and reliability, as well as the number of subscribers that the cellular system can service.

Much of this innovation has focused on service quality improvements, such as expanded digital PCS services or smaller and lighter cellular phone handsets having a longer battery life, or equipment cost reduction, such as smaller, cheaper, more reliable transceivers for the cellular base stations. However, there has been only limited innovation related to the reducing the operating costs of a cellular system.

Every cellular base station has a transmitter for sending voice and data signals to mobile units (i.e., cell phones, portable computer equipped with cellular modems, and the like) and a receiver for receiving voice and data signals from the mobile units. It is important that the transmitter power amplifier is highly linear, especially for a signal whose envelope changes in time over a wide range, such as in CDMA or multi-carrier operations. One of the techniques used in the design of highly linear amplifiers is known as the feedforward technique. In the prior art, it is based on two-loop designs. Typically, the first loop isolates the error signal produced by intermodulation distortion in the power amplifier and the second loop subtracts the error signal from the power amplifier output. However, the two-loop designs contain a high number of components and require delay lines in the power amplifier outputs that consume a large amount of power and greatly reduce the efficiency of the transmitter.

There is therefore a need in the art for improved cellular systems that are less expensive to operate. In particular, there is a need in the art for improved power amplifiers in the base station transmitters of a cellular system. More particularly, there is a need in the art for simplification and improved efficiency. A new technique disclosed herein is based on single-loop feedforward designs that do not require the use of a delay line in the power amplifier output.

SUMMARY OF THE INVENTION

To address the above-discussed deficiencies of the prior art, it is a primary object of the present invention to provide, for use in a wireless network or in other networks where linear amplifiers are needed, an improved single-loop feedforward amplification system comprising a main amplification branch and a feedforward branch in parallel to the main amplification branch. The main amplification branch contains a delay line that receives and delays the initial low-power input signal, and a power amplifier that amplifies the delayed input signal to produce an amplified output signal. The feedforward branch also receives the input signal and generates an distortion correction signal whenever the amplified output signal of the power amplifier becomes distorted due to saturation of the power amplifier. The feed forward branch may generate the distortion correction signal whenever the input signal increases above a known saturation level, or may generate the distortion correction signal whenever signal distortion is detected in the amplified output of the power amplifier.

According to one embodiment of the present invention, there is provided, for use in a transmitter in a wireless network, a feedforward amplification system comprising: 1) a first branch comprising a power amplifier capable of receiving an input signal and generating an amplified output signal from the input signal; 2) a second branch comprising distortion correction circuitry capable of receiving the input signal and generating a correction signal capable of at least partially canceling a distortion signal introduced into the amplified output signal by the power amplifier in the first branch; and 3) a combiner circuit capable of combining the amplified output signal and the correction signal to thereby at least partially cancel the distortion signal.

According to another embodiment of the present invention, the first branch further comprises a delay line for delaying a signal in the first branch.

According to still another embodiment of the present invention, the delay line delays the input signal before the input signal is received by the power amplifier.

In another embodiment of the present invention, the delay line delays the amplified output signal generated by the power amplifier.

According to yet another embodiment of the present invention, the second branch generates the correction signal whenever the input signal increases above a maximum input level capable of causing the power amplifier to enter saturation.

In still another embodiment of the present invention, the second branch generates the correction signal in response to a detection of the distortion signal in the amplified output signal.

In a further embodiment of the present invention, the second branch further comprises phase shift circuitry capable of shifting a phase of the correction signal relative to a phase of the amplified output signal.

In a still further embodiment of the present invention, the second branch further comprises gain adjustment circuitry capable of adjusting an amplitude of the correction signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIGS. 3A, 3B, 3C, 3D, 3E and 3F are diagrams illustrating signal components and distortion components in the frequency domain at various points in the prior art feedforward amplifier in FIG. 2;

FIGS. 6B and 6C are diagrams illustrating the operation of the exemplary correction signal generator in the time domain in FIG. 6A according to one embodiment of the present invention.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged wireless network.

Figure 1:
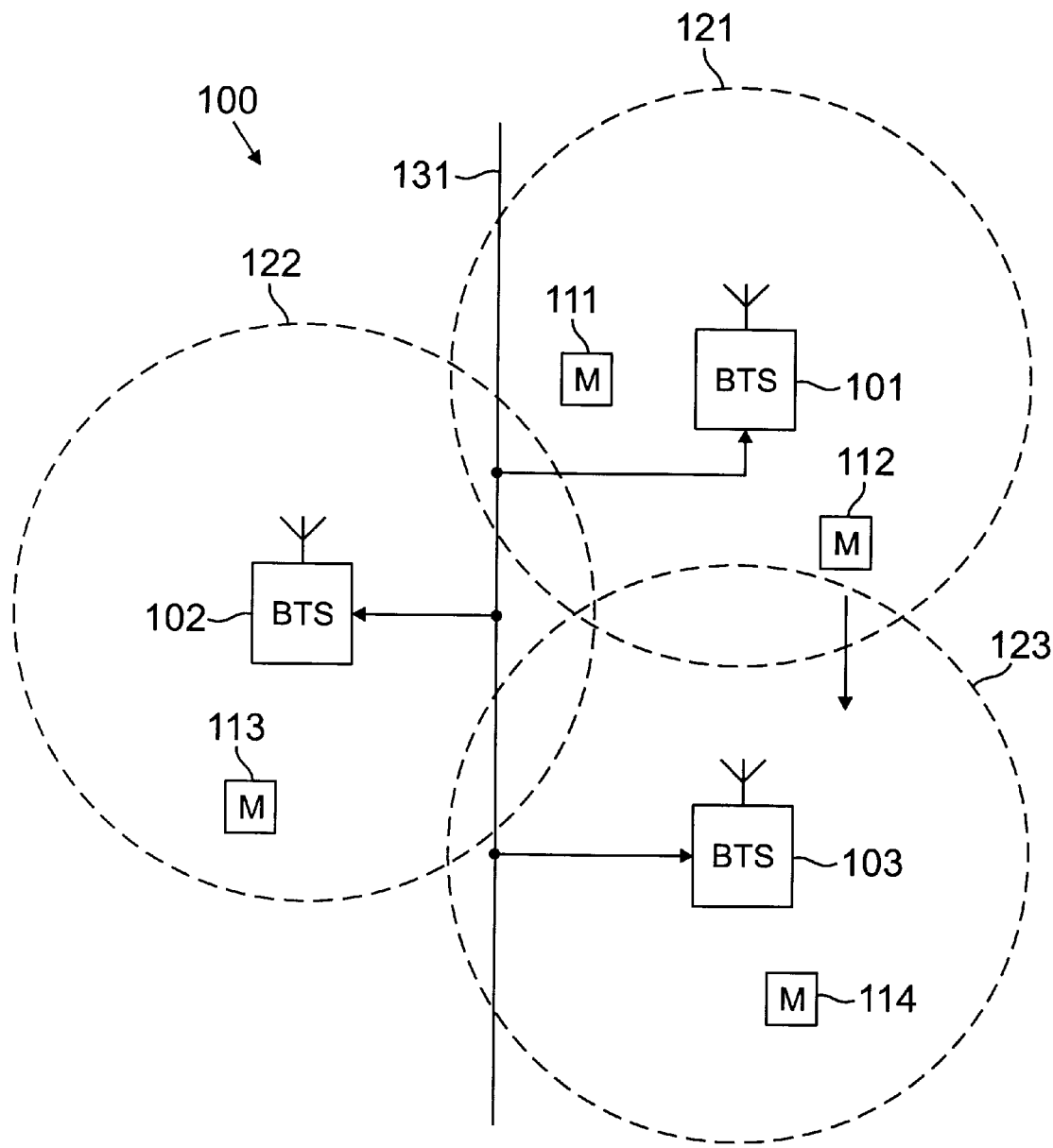
FIG. 1 illustrates an exemplary wireless network according to one embodiment of the present invention.

FIG. 1 illustrates an exemplary wireless network 100 according to one embodiment of the present invention. The wireless telephone network 100 comprises a plurality of cell sites 121–123, each containing one of the base station transceiver substations, BTS 101, BTS 102, or BTS 103. In a preferred embodiment of the present invention, the wireless telephone network 100 is a CDMA-based network. Base transceiver stations 101–103 are operable to communicate with a plurality of mobile units (M) 111–114. Mobile units 111–114 may be any suitable cellular devices, including conventional cellular telephones, PCS handset devices, portable computers, metering devices, and the like.

Dotted lines show the approximate boundaries of the cells sites 121–123 in which base transceiver stations 101–103 are located. The cell sites are shown approximately circular for the purposes of illustration and explanation only. It should be clearly understood that the cell sites may have other irregular shapes, depending on the cell configuration selected and natural and man-made obstructions.

BTS 101, BTS 102 and BTS 103 transfer voice and data signals between each other and the public telephone system (not shown) via communications line 131. Communications line 131 may be any suitable connection means, including a T1 line, a T3 line, a fiber optic link, a network backbone connection, and the like. In some embodiments, BTS 101, BTS 102 and BTS 103 may be wirelessly linked to one another and/or the public telephone network by a satellite link.

In the exemplary wireless network 100, mobile unit 111 is located in cell site 121 and is in communication with BTS 101, mobile unit 113 is located in cell site 122 and is in communication with BTS 102, and mobile unit 114 is located in cell site 123 and is in communication with BTS 103. The mobile unit 112 is located in cell site 121, close to the edge of cell site 123. The direction arrow proximate mobile unit 112 indicates the movement of mobile unit 112 towards cell site 123. At some point as mobile unit 112 moves into cell site 123 and out of cell site 121, a "handoff" will occur.

A "handoff" is a well-known process for transferring control of a call from a first cell to a second cell. For example, if mobile unit 112 is in communication with BTS 101 and senses that the signal from BTS 101 is becoming unacceptably weak, mobile 112 may then switch to a BTS that has a stronger signal, such as the signal transmitted by BTS 103. Mobile unit 112 and BTS 103 establish a new communication link and a signal is sent to BTS 101 and the public telephone network to transfer the on-going voice and/or data signals through the BTS 103. The call is thereby seamlessly transferred from BTS 101 to BTS 103.

Within each of BTS 101–103, transmitter circuitry receives voice and data traffic from communications line 131 and modulates it for transmission as, for example, a TDMA signal, an FDMA signal, or a CDMA signal. The transmitter circuitry includes a transmitter power amplifier that boosts a modulated input RF signal to the appropriate power level needed for transmission. It is important that the power amplifier maintain linearity across variations in the power and the frequency of the input RF signal. To maintain linearity, amplifiers designs that employ feedforward techniques can be used.

Figure 2:
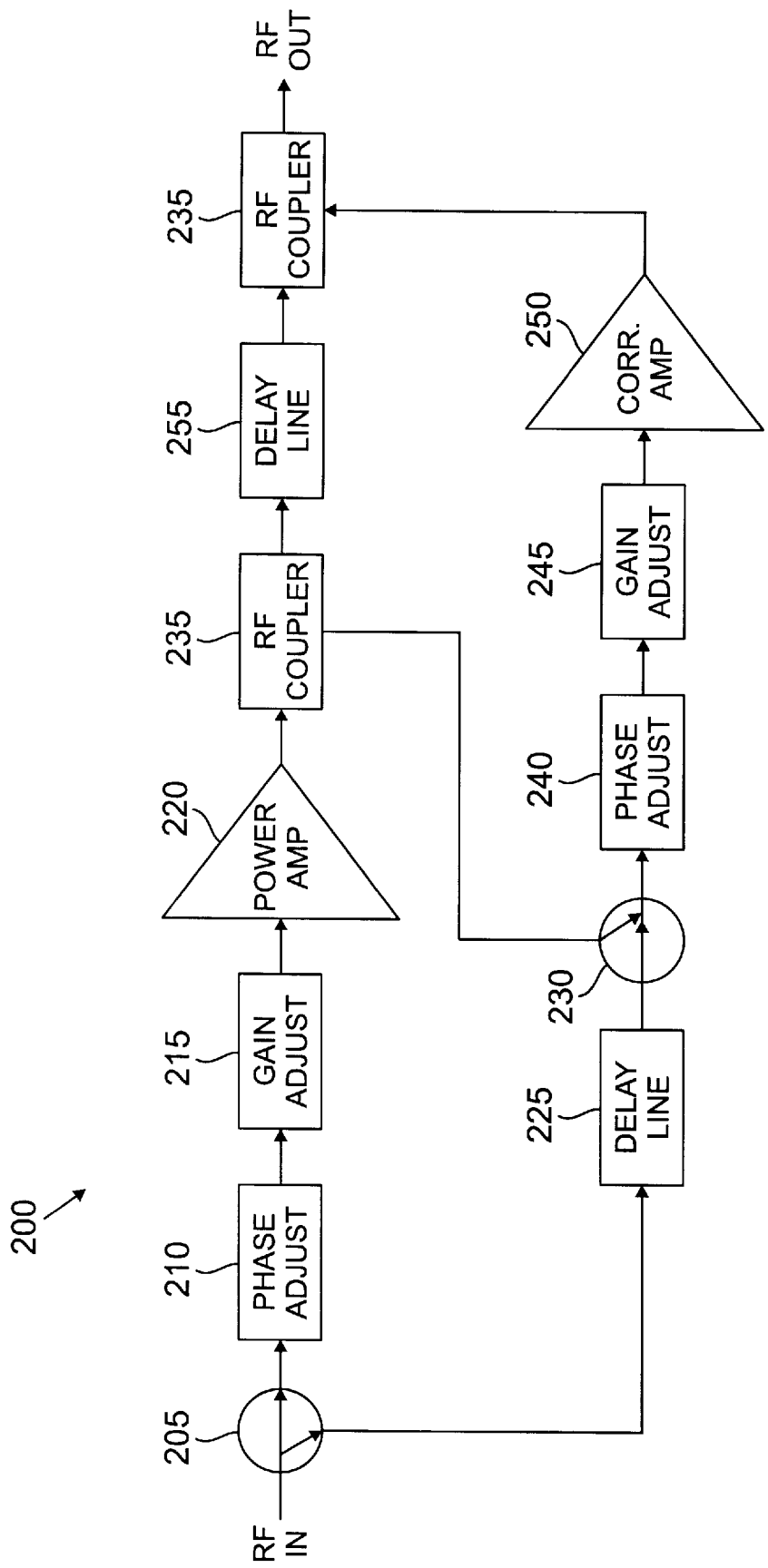
FIG. 2 illustrates a conventional feedforward amplifier for use in a BTS transmitter according to one embodiment of the prior art.

FIG. 2 illustrates conventional two-loop feedforward amplifier 200 for use in a BTS transmitter according to one embodiment of the prior art. FIGS. 3A–3F are frequency diagrams illustrating signal components and distortion components at various points in feedforward amplifier 200 in FIG. 2. FIGS. 3A–3F will also be used below in connection with FIG. 5 in the description of the present invention.

The signal RF IN, which may be a CDMA modulated signal, a TDMA modulated signal, an FDMA modulated signal, or the like, is received by signal splitter 205. FIG. 3A depicts an exemplary RF IN signal comprising signal component 301 and signal component 302. Signal component 301 occurs at a frequency of $f_1$ and signal component 302 occurs at a frequency of $f_2$. Signal splitter 205 outputs two copies of the RF IN signal, wherein each copy may optionally have some gain factor applied by signal splitter 205.

One copy of the RF IN signal is processed by phase adjust controller 210, gain adjust controller 215, and power amplifier 220. Phase adjust controller 210 may be adjusted to shift the phase of the RF IN signal. Gain adjust controller 215 may be adjusted to apply some amount of gain to the RF IN signal. Power amplifier 220 then applies a larger amount of gain to the RF IN signal received from gain adjust controller 215.

The non-linear response of power amplifier 220 produces intermodulation distortion (IMD) in the output of power amplifier 220. FIG. 3B depicts an exemplary output of power amplifier 220 in the frequency domain. The output of power amplifier 220 includes the RF IN signal, comprising signal component 301 and signal component 302, and an IMD signal, comprising signal component 303 and signal component 304. Signal component 303 occurs at a frequency of $f_3$ and signal component 304 occurs at a frequency of $f_4$.

The second copy of the RF IN signal is processed by delay line 225 and signal combiner 230. RF coupler 235 receives the (RF IN+IMD) signal on the output of power amplifier 220 and applies it to one input of signal combiner 230. RF coupler 235 may also apply some gain factor to the (RF IN+IMD) signal. The output of delay line 225 is a time-delayed version of RF IN and may be attenuated due to loss in delay line 225. The output of delay line 225 is applied to the second input of signal combiner 230, such that cancellation takes place between the RF IN component of the (RF IN+IMD) signal and the time delayed version of the RF IN signal received from delay line 225.

FIG. 3C illustrates the inverted time-delayed RF IN signal that is, in effect, combined with the (RF IN+IMD) signal by signal combiner 230. By adjusting the gain applied by gain adjust controller 215 and the phase shift applied by phase adjust controller 210, the RF IN signal components received on the two inputs of the signal combiner 230 may be aligned in equal magnitude but opposite in phase, thereby canceling each other at the output of signal combiner 230. Ideally, the output of signal combiner 230 therefore comprises only the IMD signal components received from RF coupler 235. FIG. 3D illustrates the isolated IMD signal components at the output of signal combiner 230. Optionally, signal combiner 230 may apply a gain factor to IMD signal on its output.

Thus, signal splitter 205, phase adjust controller 210, gain adjust controller 215, power amplifier 220, delay line 225, RF coupler 235 and signal combiner 230 comprise the first loop of the two-loop feedforward amplifier 200. The first loop amplifies the RF IN signal and isolates the IMD signal components, if any, produced by non-linear distortion and saturation of power amplifier 220. The second loop of the two-loop feedforward amplifier 200, described below, cancels the IMD signal components, if any, from the amplified output of power amplifier 200.

The second loop of the two-loop feedforward amplifier 200 comprises phase adjust controller 240, gain adjust controller 245 and correction amplifier 250, that are used to phase shift and amplify the isolated IMD components received from signal combiner 230. The second loop also comprises delay line 255 and RF coupler 260. The output of delay line 255 received by RF coupler 260 is a time-delayed version of the (RF IN+IMD) signal depicted in FIG. 3B and may optionally be scaled by some positive or negative gain factor caused by RF coupler 235 and/or delay line 255.

The other input of RF coupler 260 receives the IMD components illustrated in FIG. 3E from the output of correction amplifier 250. This signal is an inverted and amplified version of the isolated IMD components in FIG. 3D. Phase adjust controller 240, gain adjust controller 245 and correction amplifier 250 adjust the phase and amplitude of the IMD components received by RF coupler 260, such that cancellation of the IMD signal components on both inputs of RF coupler 260 occurs. FIG. 3F illustrates the output signal, RF OUT, on the output of RF coupler 260. The RF OUT signal is an amplified version of the RF IN signal. The IMD signal components are canceled from RF OUT.

Figure 4A:
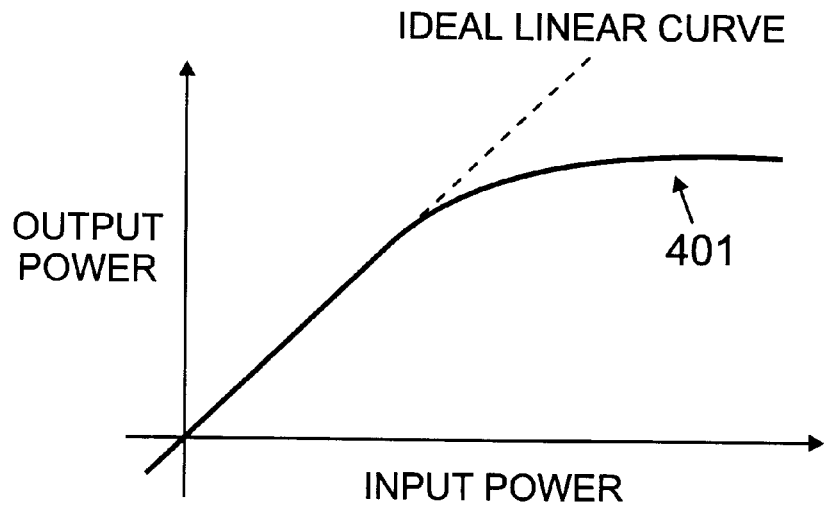
FIGS. 4A and 4B are input/output response diagrams illustrating the non-linear operation of the power amplifier in the time domain in the prior art feedforward amplifier in FIG. 2.
Figure 4B:
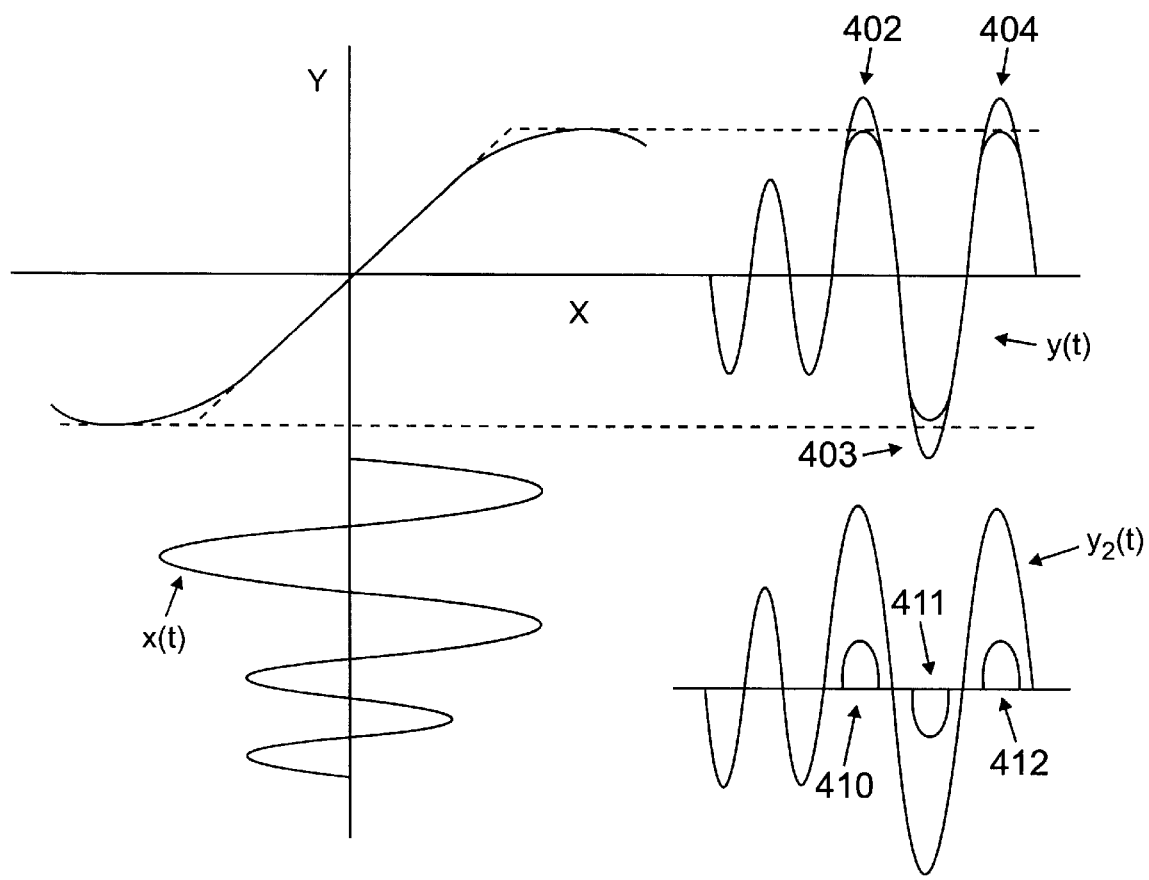

FIGS. 4A and 4B are input/output response diagrams illustrating the non-linear operation of power amplifier 220 in prior art feedforward amplifier 200 in FIG. 2. In FIG. 4A, curve 401 illustrates that as input power increases from a low level, output power initially rises linearly, as shown by the dotted line representation of the ideal linear curve. However, when input power becomes too great, the output power levels off (i.e., becomes non-linear) and the curve 401 flattens. In FIG. 4B, an exemplary sinusoidal input X(t) increases in amplitude such that the power amplifier 220 saturates. The peaks 402, 403 and 404 of the idealized output Y(t) (shown as a dotted line) are clipped and a distorted sinusoidal output results. The "missing" portions of the clipped peaks 402, 403, and 404 are shown as waveforms 410, 411 and 412 under, and in alignment with, an idealized output $Y_2(t)$ (shown as a dotted line).

The conventional two-loop feedforward amplifier 200 contains a large number of circuit elements, including two delay lines. Delay line 225 is used to compensate for the processing delays through phase adjust controller 210, gain adjust controller 215 and power amplifier 220. Delay line 255 is used to compensate for the processing delays through phase adjust controller 240, gain adjust controller 245 and correction amplifier 250. Additionally, delay line 255 is coupled to the output of power amplifier 220 and delays a high-power signal. The power loss in delay line 255 is significant and reduces the overall efficiency of the two-loop feedforward amplifier 200.

Figure 5:
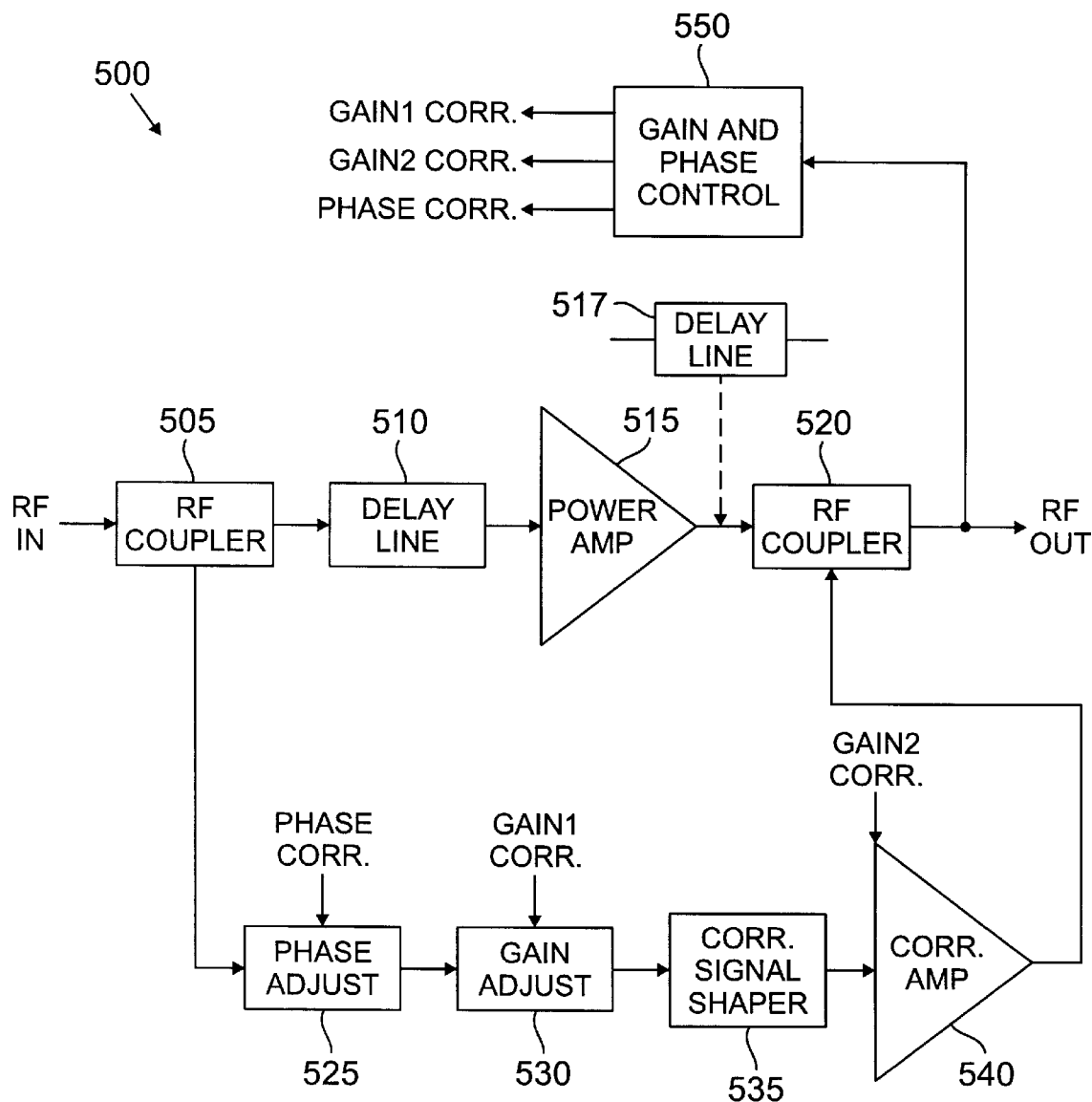
FIG. 5 illustrates an exemplary single-loop feedforward amplifier for use in a transmitter in one or more of the base transceivers in the exemplary wireless network in FIG. 1 according to one embodiment of the present invention.

FIG. 5 illustrates an exemplary single-loop feedforward amplifier 500 for use in a transmitter in one or more of BTS 101–103 in exemplary wireless network 100 according to one embodiment of the present invention. It is noted that feedforward amplifier 500 contains only one delay element, delay line 510, which is used to delay a low-power input signal, not a high-power output signal. The signal RF IN, which may be a CDMA modulated signal, a TDMA modulated signal, an FDMA modulated signal, or the like, is received by RF coupler 505.

FIG. 3A depicts the exemplary RF IN signal that is received by feedforward amplifier 500. RF IN again comprises signal component 301 and signal component 302. Signal component 301 occurs at a frequency of $f_1$ and signal component 302 occurs at a frequency of $f_2$. RF coupler 505 outputs two copies of the RF IN signal, wherein each copy may optionally have some gain factor applied by RF coupler 505.

One copy of the RF IN signal produced by RF coupler 505 is processed by delay line 510, power amplifier 515 and RF coupler 520. Since delay line 510 receives a low-power RF IN signal, the power loss in delay line 510 can be easily made up. Delay line 510 compensates for the processing delays in phase adjust controller 525, gain adjust controller 530, correction signal shaper 535 and correction amplifier 540, as explained below.

FIG. 3B depicts an exemplary output frequency domain of power amplifier 515. The output of power amplifier 515 includes the RF IN signal, comprising signal component 301 and signal component 302, and an IMD signal, comprising signal component 303 and signal component 304. The non-linear response of power amplifier 515 produces the intermodulation distortion (IMD) signal in the output of power amplifier 515.

The other copy of the RF IN signal produced by RF coupler 505 is processed by phase adjust controller 525, gain adjust controller 530, correction signal shaper 535 and correction amplifier 540. Phase adjust controller 525 may be adjusted to shift the phase of the RF IN signal. Gain adjust controller 530 may be adjusted to apply some amount of gain to the RF IN signal. In essence, correction signal shaper 535 generates the waveforms 410, 411 and 412 (shown in FIG. 4B), which correspond to the "missing" portions of the clipped peaks 402, 403, and 404 in the sinusoidal signal Y(t) in FIG. 4B. Correction amplifier 540 then amplifies the output of correction signal shaper 535. The output of correction signal shaper 535 comprises clipped parts of signal components that are used by RF coupler 505 to add, at least partly, to the clipped signal components in the output signal of power amplifier 515.

It should be noted that, in an alternate embodiment of the present invention, the delay line 510 may be coupled to the output of power amplifier 515 as delay line 517, rather than to the input of power amplifier 515. In such an embodiment, the single-loop feedforward amplifier 500 will still present a simpler and more advantageous design than the prior art feedforward amplifiers. However, positioning delay line 510 in the output of power amplifier 515 will reduce the power saving advantages of the circuit depicted in FIG. 5, since delay line 510 causes power loss which cannot be made up, when it delays the high-power signal at the output of power amplifier 515.

Figure 6A:
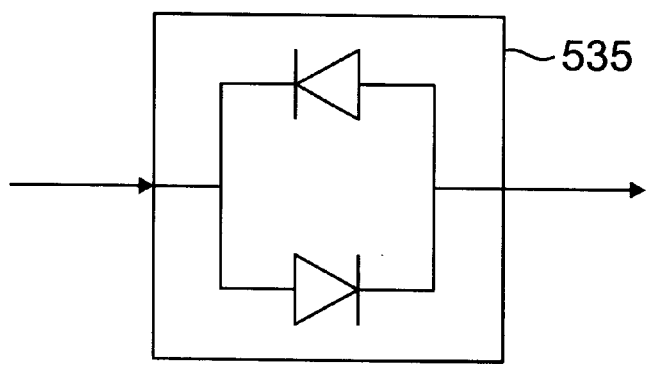
FIG. 6A illustrates an exemplary correction signal generator for use in the single-loop feedforward amplifier in FIG. 5 according to one embodiment of the present invention.

FIG. 6A illustrates an exemplary embodiment of correction signal shaper 535 which is based on diode design. Only two diodes are used in its simplest form, for illustration purposes only. FIGS. 6B and 6C are diagrams illustrating the operation of exemplary correction signal shaper 535. FIG. 6B is an input sinusoid received by correction signal shaper 535. The diodes in correction signal shaper 535 clip all portions of the input sinusoid between $+V_T$ and $-V_T$, where $+V_T$ and $-V_T$ are threshold voltages whose values are related to the non-linear characteristic of the power amplifier 515. Thus, the output of the correction signal shaper 535, shown in FIG. 6C, comprises the positive and negative clipped peaks of the input sinusoid. Phase adjust controller 525 and gain adjust controller 530 may be used to adjust the amplitudes and phase of the clipped peaks.

RF coupler 520 receives the time-delayed and amplified (RF IN+IMD) signal from power amplifier 515 and receives the (−IMD) correction signal, comprising the positive and negative clipped peaks in FIG. 6C, from correction amplifier 540. RF coupler 520 combines the two input signals and outputs the signal RF OUT. The RF OUT signal is measured and adjusted by gain and phase controller 550, which produces the correction signals GAIN1 CORRECTION, GAIN2 CORRECTION and PHASE CORRECTION.

When the RF IN signal is sufficiently small, power amplifier 515 operates linearly and its output is not clipped. At this point, the output of correction amplifier 540 is zero. However, when the RF IN signal increases and the sinusoidal peaks on the output signal of power amplifier 515 begin to clip, the correction signals GAIN1 CORRECTION, GAIN2 CORRECTION and PHASE CORRECTION are adjusted to produce on the output of correction amplifier 540 the "missing" portions of the clipped peaks (for example, waveforms 410, 411 and 412 in FIG. 4). Ideally, the clipped output of power amplifier 515 and the correction signal on the output of correction amplifier 540 are combined by RF coupler 520 such that the RF OUT signal is an non-clipped, properly amplified sinusoidal signal.

Generally, the performance characteristics of an amplifier, such as power amplifier 515, can be characterized and it is therefore possible to design correction signal shaper 535 to generate the clipped part of the signal at the output of power amplifier 515. This being the case, it will generally be possible to set the phase adjustment on phase adjust controller 525 and to set the gain adjustment on gain adjust controller 530 so that correction amplifier 540 begins to generate a correction signal when the output of power amplifier 515 becomes non-linear.

Figure 7:
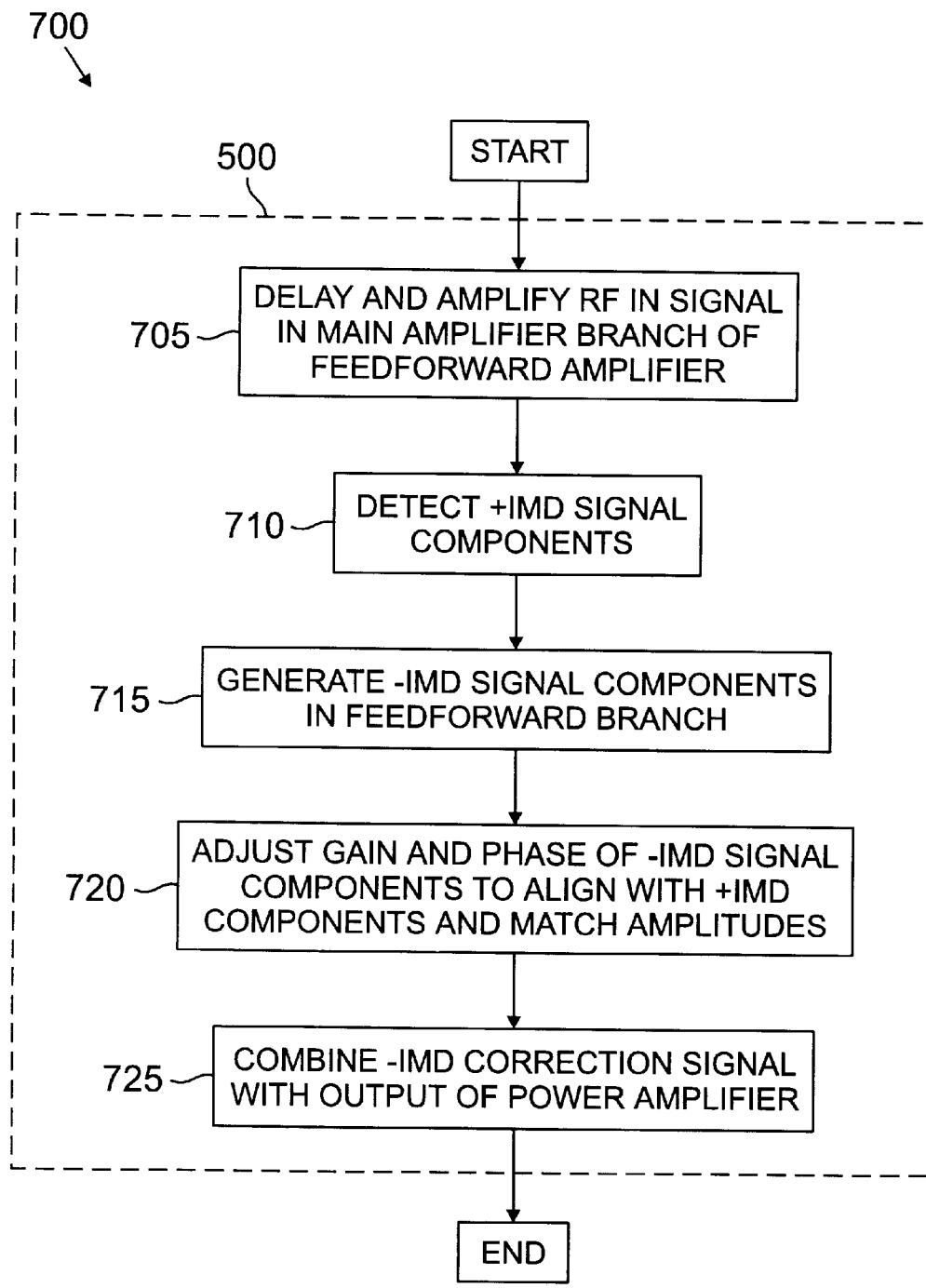
FIG. 7 is a flow diagram illustrating the operation of the exemplary single-loop feedforward amplifier in FIG. 5 according to one embodiment of the present invention.

FIG. 7 is a flow diagram 700 illustrating the operation of exemplary single-loop feedforward amplifier 500 in FIG. 5 according to one embodiment of the present invention. The input signal, RF IN, is delayed and amplified in the main amplifier branch (i.e., delay line 510 and power amplifier 515) of feedforward amplifier 500 (method step 705). Next, feedforward amplifier 500 detects intermodulation distortion (+IMD) signal components in the output signal of power amplifier 515 (method step 710). If +IMD distortion is detected, then feedforward amplifier 500 generates −IMD signal components in the feedforward branch (i.e., phase adjust controller 525, gain adjust controller 530, correction signal shaper 535, and correction amplifier 540) of feedforward amplifier 500 (method step 715).

The detection of +IMD signal components may be performed in a variety of ways. In one embodiment of the present invention, the output of power amplifier 515 may be directly measured and compared to an ideal sinusoidal waveform to detect IMD signal components. In another embodiment of the present invention, the feedforward branch of feedforward amplifier 500 may be calibrated to generate −IMD signal components whenever the RF IN signal received from RF coupler 505 increases beyond a maximum threshold amplitude. This maximum threshold amplitude corresponds to the amplitude at which power amplifier 515 begins to saturate.

Next, feedforward amplifier 500 may optionally adjust the gain and phase of the −IMD signal components in order to align the −IMD signal components with the +IMD signal components and to match the amplitudes of both, although in opposite phase (i.e., 180 degrees out-of-phase). Gain and phase are adjusted in the feedforward branch of feedforward amplifier 500 (method step 720). Finally, the −IMD correction signal produced in the feedforward branch of feedforward amplifier 500 is combined by RF coupler 520 with the output signal from power amplifier 515 to generate the corrected output signal, RF OUT (method step 725).

Although the present invention has been described in detail, those skilled in the art should understand that they can make various changes, substitutions and alterations herein without departing from the spirit and scope of the invention in its broadest form.

What is claimed is:

1. For use in a transmitter in a wireless network, a single-loop feedforward amplification system comprising:

a first branch of said single-loop feedforward amplification system comprising a power amplifier capable of receiving an input signal and generating an amplified output signal from said input signal;

a second branch of said single-loop feedforward amplification system comprising distortion correction circuitry capable of receiving said input signal and generating a correction signal capable of at least partially canceling a distortion signal introduced into said amplified output signal by said power amplifier in said first branch of said single-loop feedforward amplification system, wherein said second branch generates said correction signal whenever said input signal increases above a maximum input level capable of causing said power amplifier to enter saturation; and a combiner circuit within said single-loop feedforward amplification system capable of combining said amplified output signal and said correction signal to thereby at least partially cancel said distortion signal.

2. The single-loop feedforward amplification system set forth in claim 1 wherein said first branch further comprises a delay line for delaying a signal in said first branch.

3. The single-loop feedforward amplification system set forth in claim 2 wherein said delay line delays said input signal before said input signal is received by said power amplifier.

4. The single-loop feedforward amplification system set forth in claim 2 wherein said delay line delays said amplified output signal generated by said power amplifier.

5. The single-loop feedforward amplification system set forth in claim 1 wherein said second branch further comprises gain adjustment circuitry capable of adjusting an amplitude of said correction signal.

6. The single-loop feedforward amplification system set forth in claim 1 wherein said second branch generates said correction signal in response to a detection of said distortion signal in said amplified output signal.

7. The single-loop feedforward amplification system set forth in claim 1 wherein said second branch further comprises phase shift circuitry capable of shifting a phase of said correction signal relative to a phase of said amplified output signal.

8. The single-loop feedforward amplification system set forth in claim 1 further comprising monitoring circuitry capable of measuring an output of said combiner circuit and generating therefrom a phase correction signal capable of adjusting a phase of said correction signal relative to a phase of said amplified output signal and a gain correction signal capable of adjusting an amplitude of said correction signal.

9. A wireless communication system comprising a plurality of base stations operable to communicate with a plurality of mobile units, wherein at least one of said plurality of base stations includes a single-loop feedforward amplification system comprising:

a first branch of said single-loop feedforward amplification system comprising a power amplifier capable of receiving an input signal and generating an amplified output signal from said input signal;

a second branch of said single-loop feedforward amplification system comprising distortion correction circuitry capable of receiving said input signal and generating a correction signal capable of at least partially canceling a distortion signal introduced into said amplified output signal by said power amplifier in said first branch of said single-loop feedforward amplification system, wherein said second branch generates said correction signal whenever said input signal increases above a maximum input level capable of causing said power amplifier to enter saturation; and a combiner circuit within said single-loop feedforward amplification system capable of combining said amplified output signal and said correction signal to thereby at least partially cancel said distortion signal.

10. The wireless communication system set forth in claim 9 wherein said first branch further comprises a delay line for delaying a signal in said first branch.

11. The wireless communication system set forth in claim 10 wherein said delay line delays said input signal before said input signal is received by said power amplifier.

12. The wireless communication system set forth in claim 10 wherein said delay line delays said amplified output signal generated by said power amplifier.

13. The wireless communication system set forth in claim 9 wherein said second branch further comprises gain adjustment circuitry capable of adjusting an amplitude of said correction signal.

14. The wireless communication system set forth in claim 9 wherein said second branch generates said correction signal in response to a detection of said distortion signal in said amplified output signal.

15. The wireless communication system set forth in claim 9 wherein said second branch further comprises phase shift circuitry capable of shifting a phase of said correction signal relative to a phase of said amplified output signal.

16. The wireless communication system set forth in claim 9 further comprising monitoring circuitry capable of measuring an output of said combiner circuit and generating therefrom a phase correction signal capable of adjusting a phase of said correction signal relative to a phase of said amplified output signal and a gain correction signal capable of adjusting an amplitude of said correction signal.

17. For use in a transmitter in a wireless network, a method of amplifying an input signal in a single-loop feedforward amplification system comprising the steps of:

delaying the input signal in a delay line;

amplifying the delayed input signal to produce an amplified output signal;

determining whether the input signal exceeds a maximum input level capable of causing the step of amplifying to introduce the distortion signal into the amplified output signal;

in response to a determination that the input signal exceeds the maximum input level, generating from the input signal a correction signal capable of at least partially canceling a distortion signal introduced into the amplified output signal by the step of amplifying; and combining the amplified output signal and the correction signal to thereby at least partially cancel the distortion signal.

18. The method as set forth in claim 17 wherein the step of generating comprises the sub-step of adjusting an amplitude of the correction signal.

19. The method as set forth in claim 17 wherein the step of generating comprises the sub-step of generating the correction signal in response to a detection of the distortion signal in the amplified output signal.

20. The method as set forth in claim 17 including the further step of shifting a phase of the correction signal relative to a phase of the amplified output signal.

* * * * *